United States Patent
Kubota et al.

(10) Patent No.: US 8,547,180 B2
(45) Date of Patent: Oct. 1, 2013

(54) PACKAGE, PIEZOELECTRIC VIBRATOR AND PIEZOELECTRIC OSCILLATOR

(75) Inventors: Hajime Kubota, Kawasaki (JP); Masayuki Itoh, Kawasaki (JP); Masakazu Kishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 19 days.

(21) Appl. No.: 13/019,570

(22) Filed: Feb. 2, 2011

(65) Prior Publication Data
US 2011/0241792 A1   Oct. 6, 2011

(30) Foreign Application Priority Data
Mar. 30, 2010   (JP) ................. 2010-078135

(51) Int. Cl.
*H03B 5/32*   (2006.01)
*H01L 41/053*   (2006.01)

(52) U.S. Cl.
USPC ............. 331/68; 331/158; 310/348; 310/365

(58) Field of Classification Search
USPC ............... 29/25.35; 310/311, 348–353, 365, 310/366; 331/68, 108 C, 108 D, 116 FE, 331/116 M, 116 R, 154, 158
See application file for complete search history.

(56) References Cited

U.S. PATENT DOCUMENTS

| | | | | |
|---|---|---|---|---|
| 4,485,325 A * | 11/1984 | Yamamoto et al. | ........... | 310/344 |
| 5,596,244 A * | 1/1997 | Kugou et al. | ........... | 310/348 |
| 6,087,763 A * | 7/2000 | Kim et al. | ........... | 310/348 |
| 6,204,593 B1 * | 3/2001 | Takahashi et al. | ........... | 310/353 |
| 7,345,411 B2 * | 3/2008 | Sato et al. | ........... | 310/365 |
| 7,639,096 B2 * | 12/2009 | Ikeda et al. | ........... | 331/154 |
| 7,745,978 B2 * | 6/2010 | Harima | ........... | 310/344 |
| 8,072,279 B2 * | 12/2011 | Kasahara | ........... | 331/158 |

FOREIGN PATENT DOCUMENTS

| | | |
|---|---|---|
| JP | 07-066670 | 3/1995 |
| JP | 08-181407 | 7/1996 |
| JP | 2000-124761 | 4/2000 |
| JP | 2007-288644 | 11/2007 |

* cited by examiner

*Primary Examiner* — Levi Gannon
(74) *Attorney, Agent, or Firm* — Squire Sanders (US) LLP

(57) ABSTRACT

A package is configured to accommodate a piezoelectric element. The package includes a guide part having a plurality of spaces into which electrodes of the piezoelectric element is inserted, respectively. The plurality of spaces of the guide part are separated from each other.

10 Claims, 10 Drawing Sheets

PACKAGE, PIEZOELECTRIC VIBRATOR AND PIEZOELECTRIC OSCILLATOR

CROSS-REFERENCE TO RELATED APPLICATIONS

This application is based upon and claims the benefit of priority of the prior Japanese Patent Application No. 2010-078135, filed on Mar. 30, 2010, the entire contents of which are incorporated herein by reference.

FIELD

The embodiment discussed herein is directed to a package, a piezoelectric vibrator, and a piezoelectric oscillator.

BACKGROUND

Generally, a piezoelectric vibrator such as a crystal oscillator is configured by a piezoelectric element being accommodated in a package. External connection electrodes are provided on an outer surface of the package. The external connection electrodes are electrically connected to electrodes inside the package. The piezoelectric element is accommodated in the package in a state where electrodes of the piezoelectric element are connected to the electrodes inside the package.

Generally, the piezoelectric element is provided with two electrodes, which are connected to two electrodes inside the package by an electrically conductive adhesive, respectively. In order to connect the electrodes by the electrically conductive adhesive, first, a fixed amount of the electrically conductive adhesive is applied onto each of the electrodes inside the package, and, then, the electrically conductive adhesive is cured after placing the electrodes of the piezoelectric element on the applied electrically conductive adhesive. That is, the piezoelectric element is accommodated in the package in a state where the electrically conductive adhesive is provided between the electrodes of the piezoelectric element and the electrodes inside the package.

When the electrodes of the piezoelectric element and the electrodes inside the package are joined by the electrically conductive adhesive as mentioned above, there may occur a problem in that short-circuiting occurs due to the electrically conductive adhesive flowing to other parts or running out of the electrodes or an oscillation frequency of the piezoelectric element is changed.

Thus, Japanese Laid-Open Patent Application No. 2000-124761 suggests a piezoelectric oscillator package, which has a concave portion on an inner wall of a ceramic container and an a ceramic substrate is fixed to the ceramic container by fitting an end of the ceramic substrate into the concave portion. In this piezoelectric oscillator package, through holes are formed in the ceramic substrate so that the ceramic substrate is fixed to the ceramic container by filling an electrically conductive adhesive into the through holes.

Japanese Laid-Open Patent Application No. 2007-288644 discloses a piezoelectric substrate having a structure in which a concave portion or a through hole is provided between a part to be joined by an electrically conductive adhesive and part not to be joined by the electrically conductive adhesive in order to absorb a portion of the electrically conductive adhesive which runs out of the part to be joined by the electrically conductive adhesive.

Japanese Laid-Open Patent Application No. 8-181407 suggests a structure for mounting a mount part to a printed wiring board in which an electrically conductive paste is filled into through holes formed in the printed wiring board so that the mount part is mounted by inserting electrodes of the mount part into the electrically conductive paste in the through holes.

Further, Japanese Laid-Open Patent Application No. 7-66670 discloses a piezoelectric vibrator having a structure in which a slit is provided in each of a plurality of support plate extending from a support table so that the piezoelectric vibrator is mounted by side ends of a piezoelectric substrate being fitted into the slits.

In a case where an electrically conductive adhesive is applied onto electrodes of a package by using a dispenser, the electrically conductive adhesive in liquid form is dripped onto each electrode from a tip of a nozzle of the dispenser. In this regard, there may be a variation in an amount of drip of the electrically conductive adhesive and a position of the drip of the electrically conductive adhesive. FIG. 1 is a plan view illustrating a state where an electrically conductive adhesive is dripped onto two electrodes in a package by using a dispenser. It can be appreciated from FIG. 1 that, due to such a variation in the amount of drip and the dripped position, a size and a position of the drips of the electrically conductive adhesive 6 on the two electrodes 4-1 and 4-2 in the package 2 vary greatly.

If the position and the amount of the electrically conductive adhesive 6 vary as illustrated in FIG. 1, a problem may occur that the oscillation frequency of the piezoelectric element is unstable or the piezoelectric element cannot generate oscillation. Additionally, an oscillation frequency characteristic may be changed due to a change in a stress distribution generated in the piezoelectric element in association with aging of the electrically conductive adhesive 6.

Thus, it is desirable to achieve a mounting structure in which positions at which the electrodes of the piezoelectric element are in contact with the electrically conductive adhesive are fixed and the contact areas are also fixed even if there is a variation in the drip amount and the drip position in a case where the electrically conductive adhesive if applied by a dispenser.

SUMMARY

There is provided according to an embodiment a package configured to accommodate a piezoelectric element, the package including a guide part having a plurality of spaces into which electrodes of the piezoelectric element is inserted, respectively, wherein the plurality of spaces of the guide part are separated from each other.

There is provided a piezoelectric vibrator, including: a package provided with a guide part having a plurality of spaces; a piezoelectric element having a plurality of connection electrode parts; and an electrically conductive adhesive accommodated in the spaces of the guide part, wherein the connection electrode parts of the piezoelectric element are inserted into the plurality of spaces of the guide part, respectively, and are fixed by the electrically conductive adhesive.

The object and advantages of the embodiment will be realized and attained by means of the elements and combinations particularly pointed out in the appended claims.

It is to be understood that both the foregoing general description and the following detailed description are exemplary explanatory only and are not restrictive of the invention, as claimed.

DESCRIPTION OF EMBODIMENTS

Hereinafter, a package, a piezoelectric vibrator, and a piezoelectric oscillator according to the embodiments of the present invention will be explained with reference to the accompanying drawings.

Figure 1:
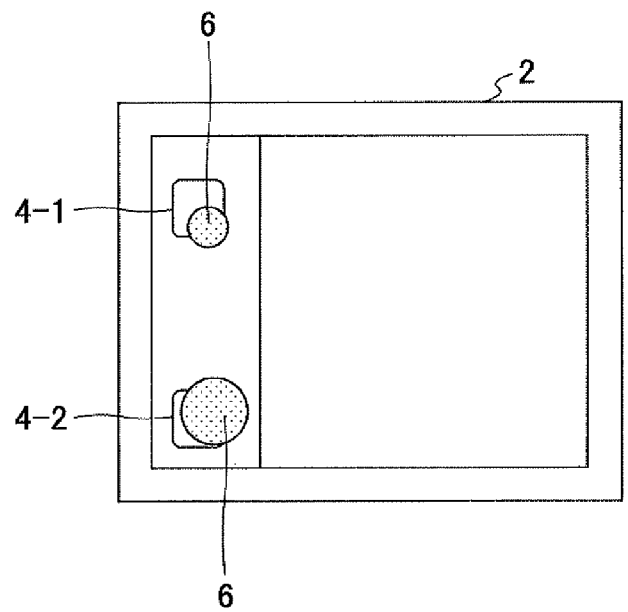
FIG. 1 is a plan view illustrating a state where an electrically conductive adhesive is dripped onto two electrodes in a package by using a dispenser.
Figure 2:
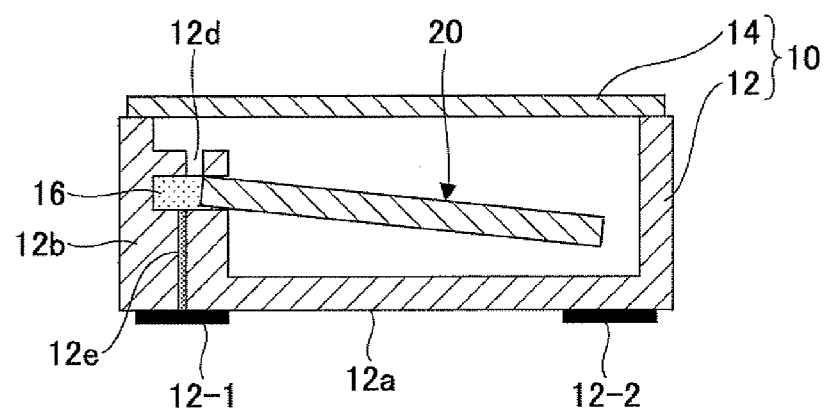
FIG. 2 is a cross-sectional view of a piezoelectric vibrator according a first embodiment.

FIG. 2 is a cross-sectional view of a piezoelectric vibrator according to a first embodiment. The piezoelectric vibrator according to the first embodiment includes a ceramic package 10, which is an example of a package, and a crystal oscillator 20, which is an example of a piezoelectric element accommodated in the ceramic package 10. The ceramic package 10 includes a box-shaped main body part 12 having an internal space and a lid part 14 for closing the internal space of the main body part 12. External electrodes 12-1 and 12-2 are formed on a bottom surface 12a of the main body part 12 to mount the piezoelectric vibrator onto a circuit board.

Figure 3:
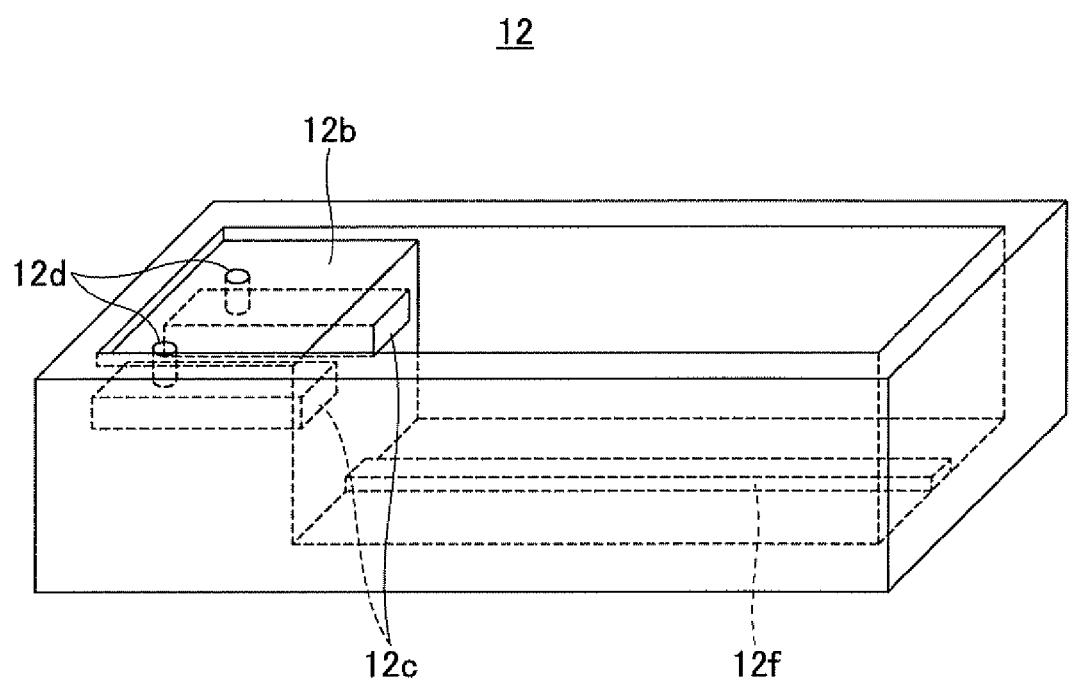
FIG. 3 is a perspective view of a main body part of a ceramic package.

FIG. 3 is a perspective view of the main body part 12 of the ceramic package 10. A wall of one side of the main body part 12 is made thick in order to form an oscillator mount part 12b. Two slots 12c are formed in the oscillator mount part 12b. Two connection electrode parts of the crystal oscillator 20 are inserted into the slots 12c, respectively, as mentioned later, and an electrically conductive adhesive 16 is filled into the slots 12c through penetrating holes 12d. That is, the two slots 12c form mutually separated spaces into which the two connection electrode parts of the crystal oscillator 20 are inserted respectively. Thus, the oscillator mount part 12b having the two slots 12c as a plurality of spaces, which are separated from each other, serves as a guide part for guiding the crystal oscillator 20 to a fixing position.

A through hole 12e is formed between a portion of the slot 12c into which the electrically conductive adhesive 16 is filled and the external connection electrode 12-1. Accordingly, the connection electrode formed in one of the connection electrode parts of the crystal oscillator 20 is electrically connected to the external connection electrode 12-1 through the electrically conductive adhesive 16 filled in the slot 12c and the through hole 12e. On the other hand, the connection electrode formed in the other of the connection electrode parts of the crystal oscillator 20 is electrically connected to the external connection electrode 12-2 through the electrically conductive adhesive 16 filled in the slot 12c, the through hole 12e and a wiring pattern (not illustrated in the figure) formed inside the main body part 12.

A partition part 12f is formed on a bottom surface of an interior of the main body part 12. The partition part 12f is provided to prevent the electrically conductive adhesive 16 in the two slots 12c from short-circuiting if the electrically conductive adhesive 16 overspills when filling the electrically conductive adhesive 16 into the slots 12c, as mentioned later. If the electrically conductive material 16 overspills from the slots 12c, the overspilled electrically conductive adhesive 16 flows along the side wall of the oscillator mount part 12b and accumulates on the bottom surface of the interior of the main body part 12. If the electrically conductive adhesives 16 overspilling from both of the slots 12 spread on the bottom surface of the interior of the main body part 12 and are brought into contact with each other, the electrically conductive adhesives 16 filled in the two slots 12c electrically short-circuit with each other. Thus, the partition part 12f is provided to protrude from the bottom surface of the interior of the main body part 12 in order to separate the electrically conductive adhesives 16 flowing to the bottom surface to prevent the above-mentioned short-circuiting.

Figure 4:
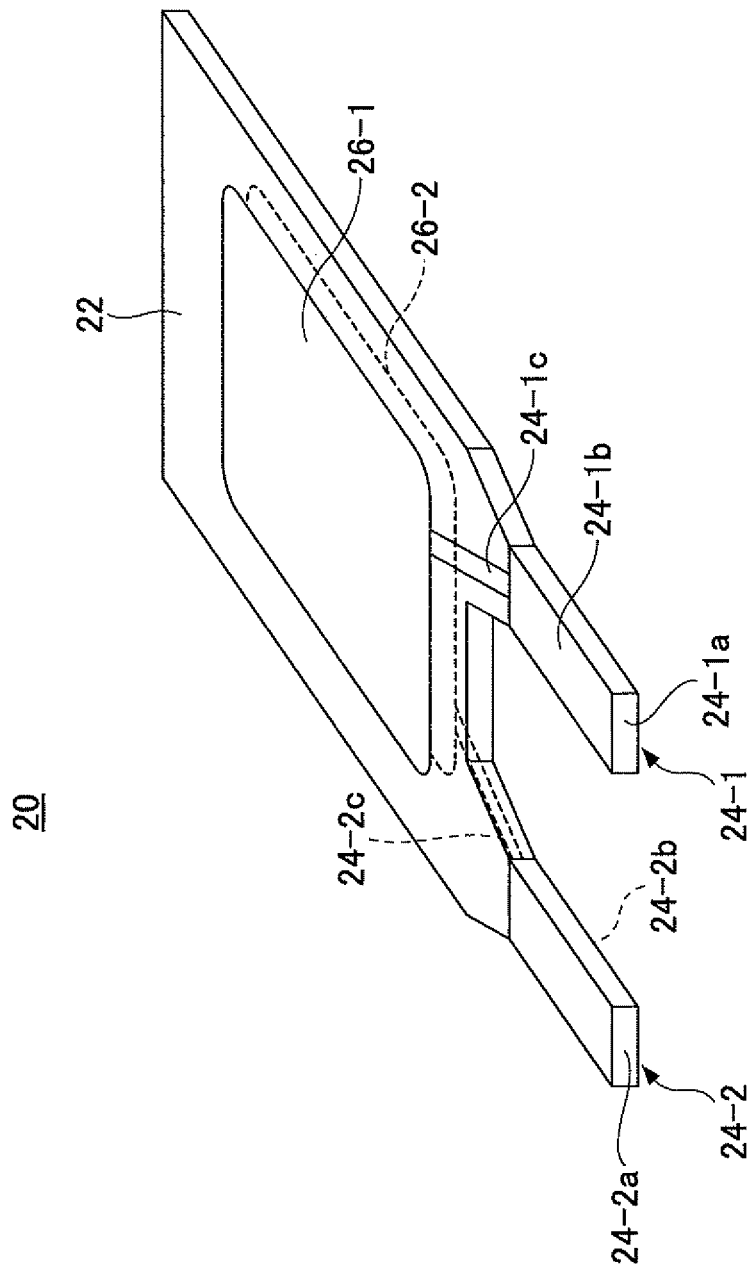
FIG. 4 is a perspective view of a crystal oscillator.
Figure 5:
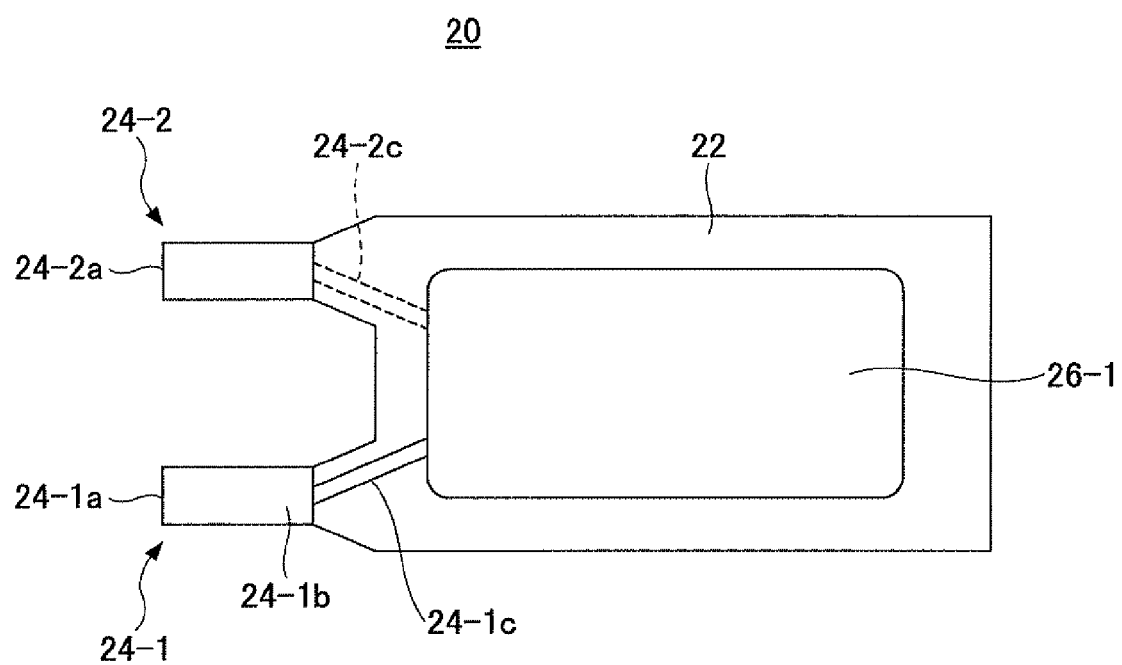
FIG. 5 is a plan view of the crystal oscillator.

A description will be given below of the crystal oscillator 20 with reference to FIG. 4 and FIG. 5. FIG. 4 is a perspective view of the crystal oscillator 20. FIG. 5 is a plan view of the crystal oscillator 20.

The crystal oscillator 20 includes a rectangular crystal piece 22 and two connection electrode parts 24-1 and 24-2 which extend from one side of the crystal piece 22. A pair of drive electrodes 26-1 and 26-2 are formed on the opposite surfaces (front side and back side) of the crystal piece 22. The crystal piece 22 is oscillated by applying an oscillation voltage to the drive electrodes 26-1 and 26-2. Although there is no limitation that which particular side of the crystal piece 22 is a front side, the side on which the drive electrode 26-1 is formed is made into the front side for convenience here.

Each of the connection electrode parts 24-1 and 24-2 has a flat rectangular form, and connection electrodes are formed on the surfaces thereof, respectively. Although it is desirable to form the connection electrodes on the entire surfaces of the connection electrode parts 24-1 and 24-2, the connection electrodes may be formed at least the end surfaces and the front surface or the back surface of the connection electrode parts 24-1 and 24-2. In FIG. 4, the connection electrode 24-1a is an electrode formed on the end surface of the connection electrode part 24-1 and the connection electrode 24-2a is an electrode formed on the end surface of the connection electrode part 24-2. The connection electrode 24-1a is connected to the connection electrode 24-1b formed on the surface of the front side of the connection electrode part 24-1, and the connection electrode 24-2a is connected to the connection electrode 24-2b formed on the surface of the back side of the connection electrode part 24-2.

The connection electrode 24-1a formed on the surface of the front side of the connection electrode part 24-1 is electrically connected to the drive electrode 26-1 formed on the surface of the front side of the crystal piece 22. Therefore, the connection electrode 24-1a formed on the end surface of the connection electrode part 24-1 is electrically connected to the drive electrode 26-1 through the connection electrode 24-1b and an electric conduction connection part 24-1c. On the other hand, the connection electrode 24-2a formed on the surface of the back side of the connection electrode part 24-2 is electrically connected to the drive electrode 26-2 formed on the surface of the back side of the crystal piece 22 through an electric conduction connection part 24-2c. Therefore, the connection electrode 24-2a formed on the end surface of the connection electrode part 24-2 is electrically connected to the drive electrode 26-2 through the connection electrode 24-2b and the electric conduction connection part 24-2c.

In the above-mentioned electrode structure, when a drive voltage is applied to the connection electrodes 24-1a and 24-2a of the connection electrode parts 24-1 and 24-2, the drive voltage is transmitted to the drive electrodes 26-1 and 26-2, which causes the crystal piece 22 to oscillate.

It should be noted that the crystal oscillator 20 before the electrodes are formed is formed by processing a crystal board into a shape illustrated in FIG. 5 and polishing a portion corresponding to the crystal piece 22 to have a thickness with which an oscillation of a predetermined frequency is generated.

Figure 6:
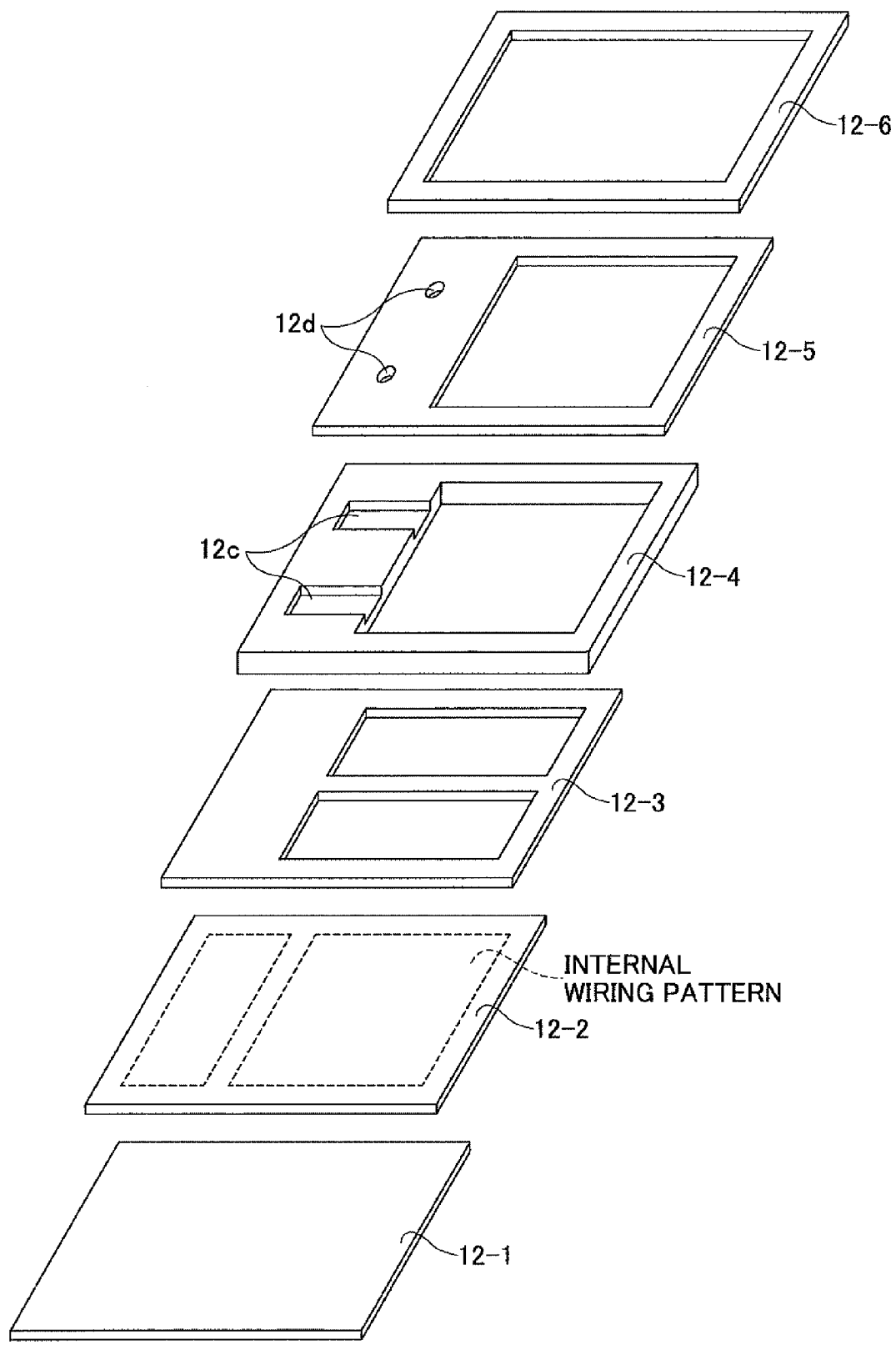
FIG. 6 is an exploded perspective view for illustrating an example of a manufacturing method of the main body part of the ceramic package.

Next, a description will be given of a method of forming the main body part 12 of the ceramic package 10. FIG. 6 is an exploded perspective view illustrating an example of a method of forming the main body part 12 of the ceramic package 12.

The main body part 12 of the ceramic package 10 can be formed by laminating ceramic sheets formed in predetermined shapes and sintering the lamination. In the example illustrated in FIG. 6, a ceramic sheet 12-2 having an internal wiring pattern formed thereon is laminated on a ceramic sheet 12-1 serving as a bottom plate. Then, a ceramic sheet 12-3 in which a portion corresponding to the partition part 12f is formed is laminated on the ceramic sheet 12-2. Then, a ceramic sheet 12-4 in which a portion to be an inner space and portions to be the two slots 12c are formed is laminated on the ceramic sheet 12-3. Then, a ceramic sheet 12-5 in which a portion to be the inner space and a portion to be the penetrating hole 12b are formed is laminated on the ceramic sheet 12-4. Finally, a ceramic sheet 12-6 to be an upper edge of the main body part 12 is laminated on the ceramic sheet 12-5. The thus-formed lamination of the ceramic sheets 12-1 to 12-6 is sintered to form the main body part 12 of the shape illustrated in FIG. 3.

Figure 7A:
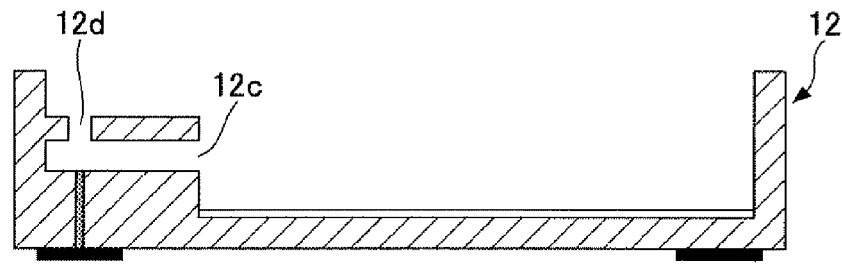
FIGS. 7A, 7B and 7C are cross-sectional views illustrating a process of mounting the crystal oscillator to the main body part of the ceramic package.
Figure 7B:
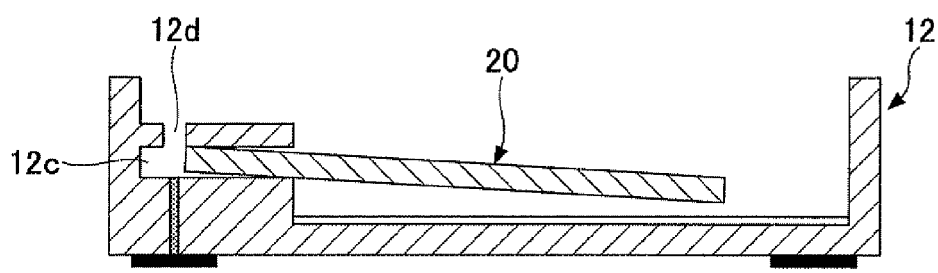
Figure 7C:
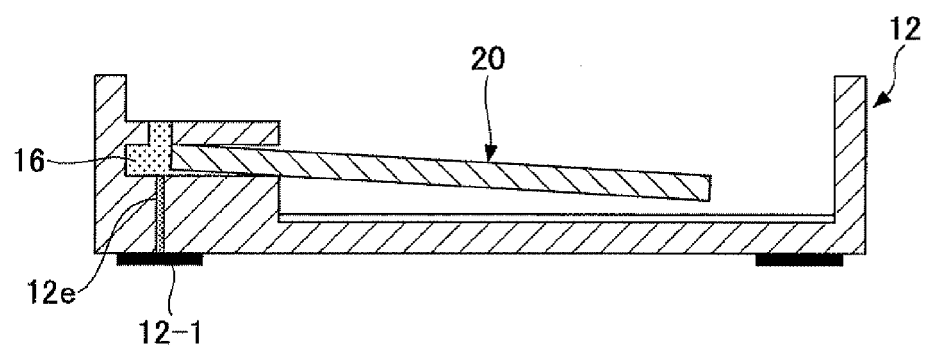

A description will be given below, with reference to FIGS. 7A through 7C, of a process of attaching the crystal oscillator 20 to the main body part 12. FIGS. 7A through 7C are cross-sectional views illustrating a process of attaching the crystal oscillator 20 to the main body part 12.

First, as illustrated in FIG. 7A, the main body part 12 of the ceramic package 10 is prepared. Then, as illustrated in FIG. 7B, the connection electrode parts 24-1 and 24-2 of the above-mentioned crystal oscillator 20 are inserted into the slots 12c of the main body part 12, respectively, in order to accommodate the crystal oscillator 20 in the inner space of the main body part 12. When inserting the connection electrode parts 24-1 and 24-2 into the two slots 12c of the main body part 12, it becomes difficult to insert the connection electrode parts 24-1 and 24-2 further because the width of the base part of each of the connection electrode parts 24-1 and 24-2 is larger than other parts of the connection electrode parts 24-1 and 24-2.

Figure 8:
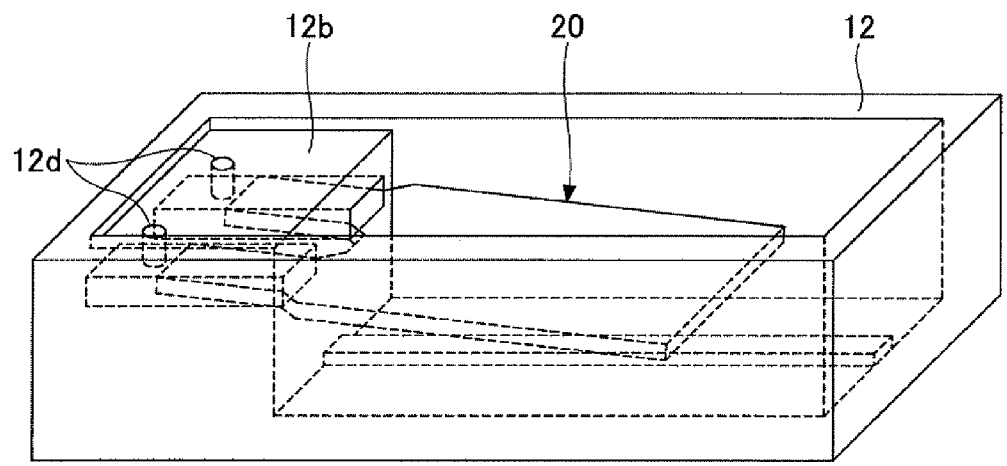
FIG. 8 is a perspective vies of the main body part and the crystal oscillator in a state illustrated in FIG. 7A.

In the state illustrated in FIG. 7B, the connection electrode parts 24-1 and 24-2 of the crystal oscillator 20 cannot be inserted further, which is a state where the connection electrode parts 24-1 and 24-2 are inserted completely. FIG. 8 is a perspective view of the main body part 12 and the crystal oscillator 20 in the state illustrated in FIG. 7B. In this state, the end surfaces of the connection electrode parts 24-1 and 24-2 of the crystal oscillator 20 do not reach the bottom surfaces of the slots 12c, and spaces are formed between the end surfaces of the connection electrode parts 24-1 and 24-2 and the bottom surfaces of the slots 12c, respectively. Then, the penetrating holes 12d provided above the slots 12c are formed at positions where the penetrating holes 12d communicate with the above-mentioned space.

When the state illustrated in FIG. 7B is achieved, the electrically conductive adhesive 16 of a liquid state is filled into the above-mentioned spaces through the penetrating holes 12c. Because the connection electrode parts 24-1 and 24-2 incline in the slots 12c due to the weight of the crystal oscillator 20, the extreme ends of the connection electrode parts 24-1 and 24-2 are brought into contact with the upper surfaces of the slots 12C. Thus, the electrically conductive adhesive 16 does not flow along the upper surfaces of the slots 12c. Additionally, because the connection electrode parts 24-1 and 24-2 incline in the slots 12c due to the weight of the crystal oscillator 20, the base parts of the connection electrode parts 24-1 and 24-2 are brought into contact with the lower surfaces of the slots 12c. Thus, the electrically conductive adhesive 16 flowing along the lower surfaces of the slots 12c is stopped in the vicinity of the base parts of the connection electrode parts 24-1 and 24-2, and is prevented from flowing further beyond the base parts of the connection electrode parts 24-1 and 24-2. Accordingly, the electrically conductive adhesive 16 filled into the deep portions of the slots 12c is retained within the slots 12c and is not flow out of the slots 12c through the opening parts of the slots 12c.

After filling the electrically conductive adhesive 16 into the slots 12c, the electrically conductive adhesive 16 is heated and cured. Thereby, the crystal oscillator 20 is mechanically fixed in the interior of the main body part 12. Simultaneously, the connection electrodes 24-1a and 24-2a formed on the end surfaces of the connection electrode parts 24-1 and 24-2 are electrically connected to the external connection electrodes 12-1 and 12-2 through the electrically conductive adhesive 16 and the through holes 12e.

Figure 9:
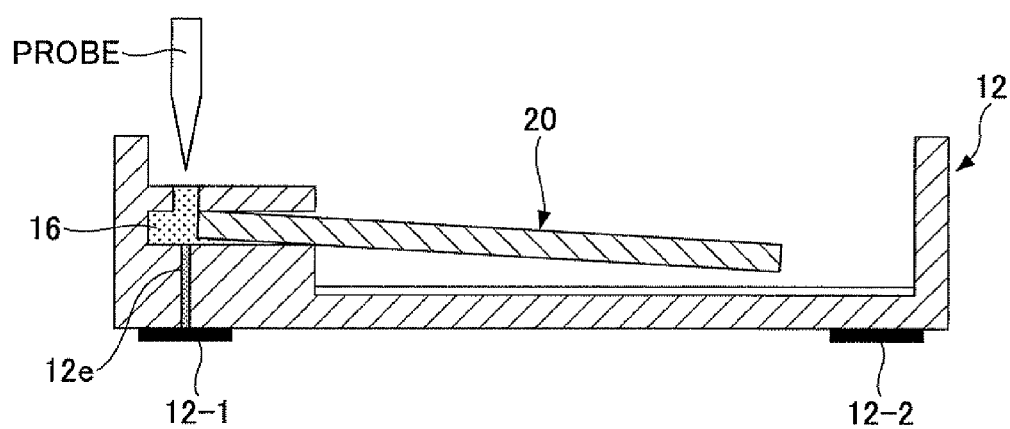
FIG. 9 is a cross-sectional view for illustrating an electrical contact by bringing a probe into contact with an electrically conductive adhesive in a through hole.

Here, when testing an operation of the crystal oscillator 20 in the state where the crystal oscillator 20 is fixed by the electrically conductive adhesive 16, an electric test of the crystal oscillator 20 can be carried out by bringing the probes into contact with the electrically conductive adhesive 16 cured in the penetrating holes 12d as illustrated in FIG. 9 to apply a voltage to the crystal oscillator 20.

Figure 10:
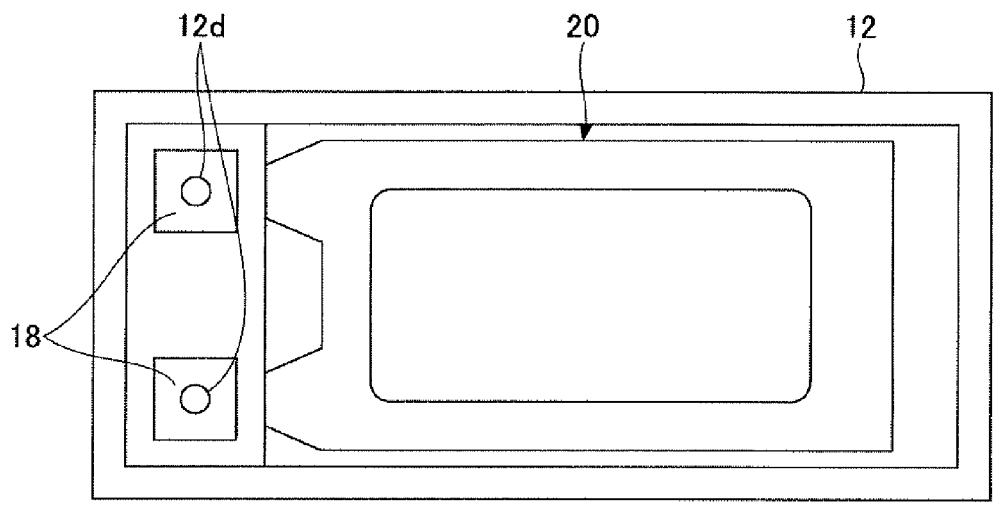
FIG. 10 is a plan view of the main body part having a test electrode around a through hole.

Moreover, test electrode 18 may be formed around each of the penetrating holes 12d so that the electrically conductive adhesive 16 in the penetrating hole 12d is brought into contact with the test electrode 18, illustrated in FIG. 10. Thereby, the electric test of the crystal oscillator 20 can be carried out while easily bringing the probe illustrated in FIG. 9 into contact with the test electrode 18.

Figure 11:
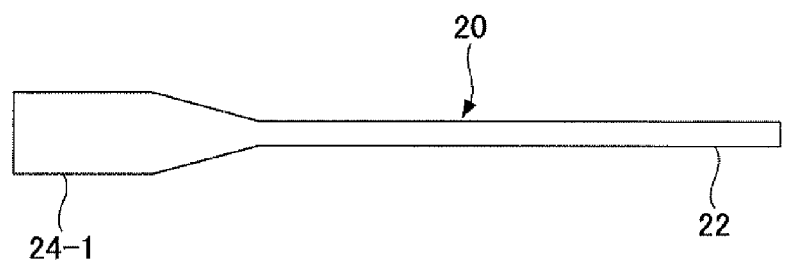
FIG. 11 is a side view of a variation of the crystal oscillator.

The thickness of the connection electrode parts 24-1 and 24-2 is set slightly smaller than the height of the slots 12c. Thereby, the crystal oscillator 20 is fixed in a slightly inclined state. However, an oscillation frequency of the crystal oscillator 20 is adjusted by adjusting the thickness of the crystal piece 22 of the crystal oscillator 20. In the above-mentioned embodiment, the thickness of the connection electrode parts 24-1 and 24-2 is equal to the thickness of the crystal piece 22, and the entire crystal oscillator 20 has a uniform thickness. Accordingly, if the thickness of the crystal piece 22 is reduced, the thickness of the connection electrode parts 24-1 and 24-2 is reduced. However, there may be a case in which the thickness of the connection electrode parts 24-1 and 24-2 cannot be reduced due to tolerance in the size of the slots 12c. For example, if the thickness of the connection electrode parts 24-1 and 24-2 is reduced, the tolerance in the size of the slots 12c is increased relatively, which results in a case where the inclination of the crystal oscillator 20, when the crystal oscillator 20 is attached to the main body part 12, is increased. In such a case, it is possible that the inclined crystal oscillator 20 contacts the bottom surface or the partition part 12f of the inner space of the main body part 12. Thus, the crystal oscillator 20 may be formed so that the thickness of only the crystal piece 22 is reduced by maintaining the thickness of the connection electrode parts 24-1 and 24-2 to some extent. FIG. 11 is a plan view of the crystal oscillator 20.

Next, a description will be given of a piezoelectric oscillator according to a second embodiment.

Figure 12:
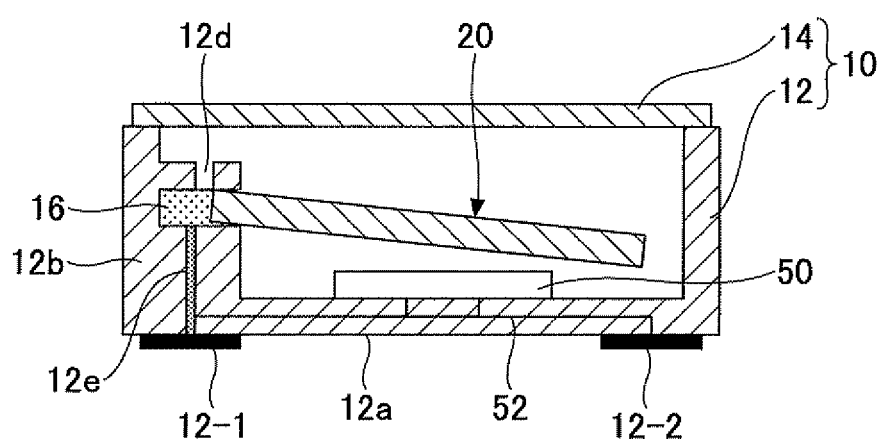
FIG. 12 is a cross-sectional view of a piezoelectric oscillator according to a second embodiment.

FIG. 12 is a cross-sectional view of a crystal oscillator, which is an example of a piezoelectric oscillator according to the second embodiment. In FIG. 12, parts that are the same as the parts illustrated in FIG. 2 are given the same reference numerals, and descriptions thereof will be omitted.

The crystal oscillator has the same structure as the above-mentioned crystal oscillator, but differs in that an IC 50 containing an oscillation circuit is accommodated in the main body part of the ceramic package 10. The IC 50 is mounted on the bottom surface of the interior of the main body part 12 underneath the crystal oscillator 20.

Wiring (not illustrated in the figure) is formed on the bottom surface of the interior of the main body part 12, and the wiring is connected to electrodes of the IC 50. Additionally, the wiring is connected to the external connection electrodes 12-1 and 12-2 through wiring 52 inside the main body part 12. Further, the electrodes of the IC 50 are electrically connected to the electrically conductive adhesive 16 through the wiring 52 and the through holes 12e.

As mentioned above, in the piezoelectric oscillator according to the present embodiment, an IC is provided in the package of the piezoelectric oscillator and wiring to the IC is formed in the package.

Figure 13:
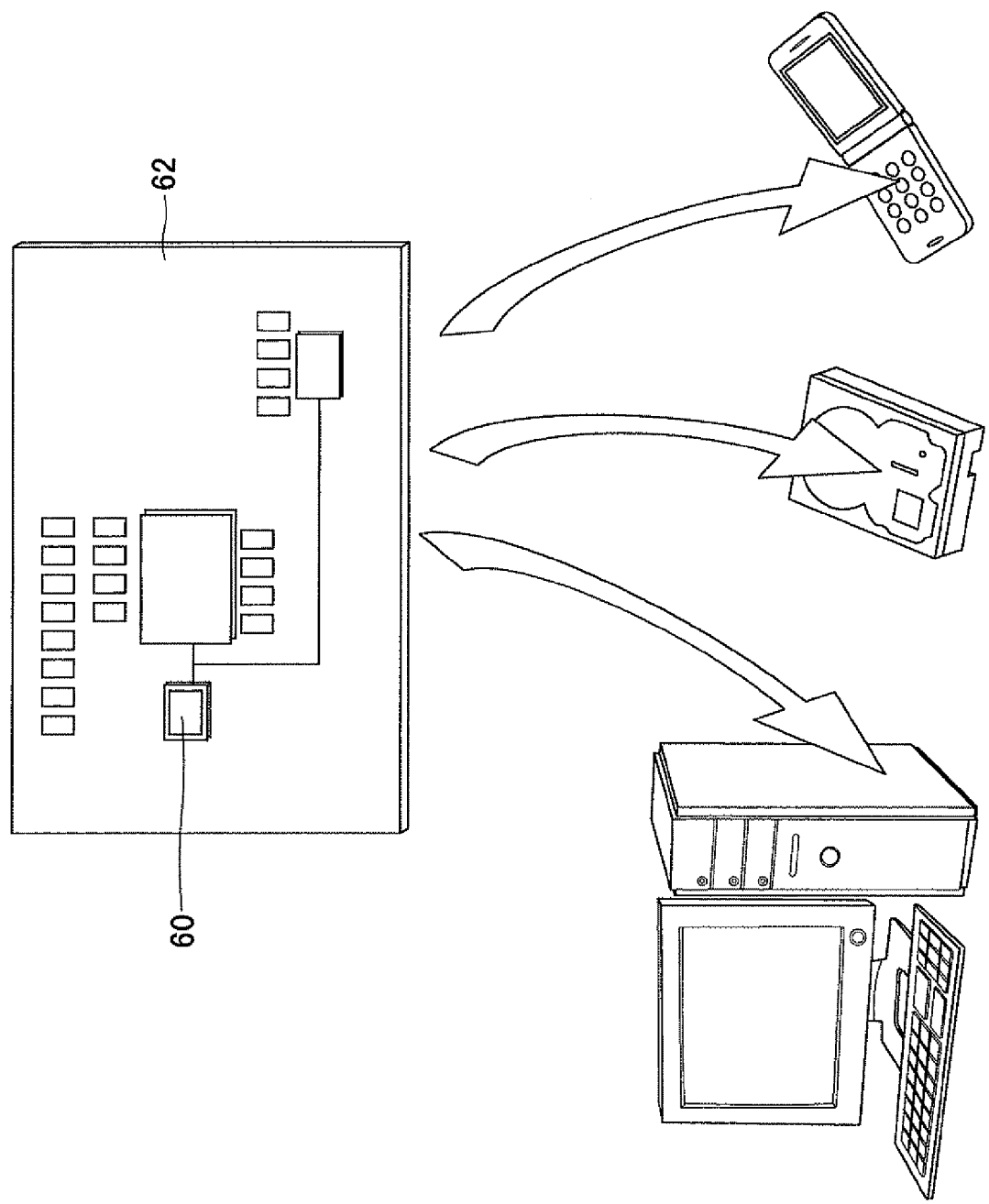
FIG. 13 is an illustration for explaining applications of the crystal oscillator.

As illustrated in FIG. 13, the crystal oscillator 60 having the above-mentioned structure is mounted on a printed board 62 as one of elements constituting an electronic circuit, and is incorporated into electronic equipment such as a personal computer, a hard disk drive, a cellular phone, etc.

All examples and conditional language recited herein are intended for pedagogical purposes to aid the reader in understanding the principles of the invention and the concepts contributed by the inventor to furthering the art, and are to be construed a being without limitation to such specifically recited examples and conditions, nor does the organization of such examples in the specification relates to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A package configured to accommodate a piezoelectric element, the package comprising a guide part having a plurality of spaces into which a plurality of electrodes of said piezoelectric element is inserted, respectively, the plurality of spaces of said guide part being separated from each other,
   wherein each of said plurality of spaces is defined by an elongated cavity longitudinally extending in a wall of the package inwardly from an opening formed at an inner surface of the wall of the package,
   wherein a through hole is provided on an upper surface of each of said plurality of spaces so that an electrically conductive adhesive is filled into each of said plurality of spaces through the through hole.

2. The package according to claim 1, wherein a partition part is provided on a bottom surface of an interior of a space to accommodate said piezoelectric element, the partition part protruding from the bottom surface.

3. The package according to claim 1, wherein each of said plurality of spaces includes slots open to a side surface of said guide part, and each of the slots has a shape corresponding to a connection electrode part on which an electrode of said piezoelectric element is formed.

4. The package according to claim 3, wherein a depth of said slots is set longer than a length of said connection electrode part of said piezoelectric element, and a distance between said side surface of said guide part and said through hole is set longer than a length of said connection electrode part of said piezoelectric element.

5. A piezoelectric vibrator, comprising:
   a package provided with a guide part having a plurality of spaces;
   a piezoelectric element having a plurality of connection electrode parts inserted into said plurality of spaces, respectively; and
   an electrically conductive adhesive accommodated in said plurality of spaces of said guide part to fix said plurality of connection electrode parts inserted into said plurality of spaces, respectively,
   wherein each of said plurality of spaces is defined by an elongated cavity longitudinally extending in a wall of the package inwardly from an opening formed at an inner surface of the wall of the package,
   wherein said guide part has a plurality of penetrating holes connecting to said plurality of spaces, respectively.

6. The piezoelectric vibrator according to claim 5, wherein a connection electrode is formed on an end surface of each of said plurality of connection electrode parts of said piezoelectric element, the connection electrode for driving said piezoelectric element.

7. The piezoelectric vibrator according to claim 6, wherein a partition part is provided on a bottom surface of an interior of a space in which said piezoelectric element is accommodated, the partition part protruding from the bottom surface.

8. The piezoelectric vibrator according to claim 6, wherein each of said plurality of spaces is a slot open to a side surface of said guide part, and the slot has a shape corresponding to each of said plurality of connection electrode parts of said piezoelectric element.

9. The piezoelectric vibrator according to claim 8, wherein a depth of each of said slots is set longer than a length of each of said plurality of connection electrode parts of said piezoelectric element, and a distance between said side surface of said guide part and each of said plurality of penetrating holes is set longer than a length of each of said plurality of connection electrode parts of said piezoelectric element.

10. A piezoelectric oscillator, comprising:
    the piezoelectric vibrator according to claim 5; and
    an integrated circuit accommodated in said package to drive said piezoelectric element by being electrically connected to said piezoelectric element.

* * * * *